United States Patent
Li et al.

(10) Patent No.: US 7,235,407 B2
(45) Date of Patent: *Jun. 26, 2007

(54) SYSTEM AND METHOD FOR FORMING A BIPOLAR SWITCHING PCMO FILM

(75) Inventors: Tingkai Li, Vancouver, WA (US); Lawrence J. Charneski, Vancouver, WA (US); Wei-Wei Zhuang, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 134 days.

This patent is subject to a terminal disclaimer.

(21) Appl. No.: 10/855,942

(22) Filed: May 27, 2004

(65) Prior Publication Data
US 2005/0275064 A1    Dec. 15, 2005

(51) Int. Cl.
*H01L 21/00* (2006.01)
(52) U.S. Cl. ............................ 438/3; 438/238; 438/240
(58) Field of Classification Search .................... 438/3, 438/238–240, 381, 241–256, 386–399
See application file for complete search history.

(56) References Cited

U.S. PATENT DOCUMENTS
6,927,120 B2 * 8/2005 Hsu et al. .................... 438/240
2005/0040482 A1 * 2/2005 Suzuki et al. ............... 257/411

* cited by examiner

*Primary Examiner*—H. Jey Tsai
(74) *Attorney, Agent, or Firm*—Law Office of Gerald Maliszewski; Gerald Maliszewski

(57) ABSTRACT

A multi-layer $Pr_xCa_{1-x}MnO_3$ (PCMO) thin film capacitor and associated deposition method are provided for forming a bipolar switching thin film. The method comprises: forming a bottom electrode; depositing a nanocrystalline PCMO layer; depositing a polycrystalline PCMO layer; forming a multi-layer PCMO film with bipolar switching properties; and, forming top electrode overlying the PCMO film. If the polycrystalline layers are deposited overlying the nanocrystalline layers, a high resistance can be written with narrow pulse width, negative voltage pulses. The PCMO film can be reset to a low resistance using a narrow pulse width, positive amplitude pulse. Likewise, if the nanocrystalline layers are deposited overlying the polycrystalline layers, a high resistance can be written with narrow pulse width, positive voltage pulses, and reset to a low resistance using a narrow pulse width, negative amplitude pulse.

21 Claims, 4 Drawing Sheets

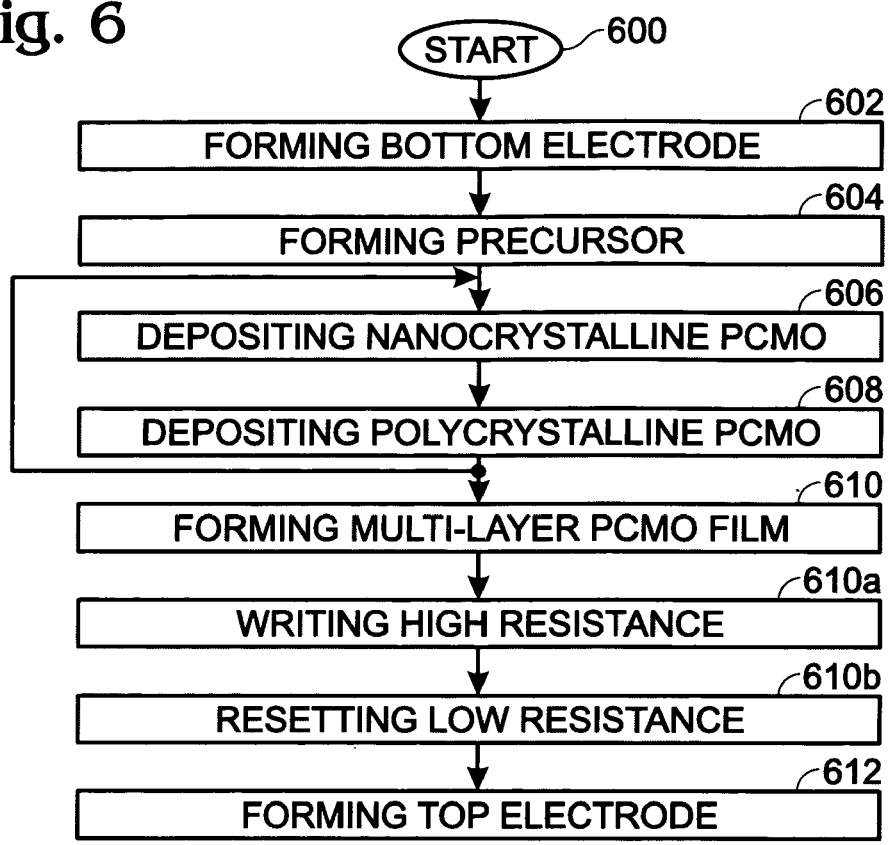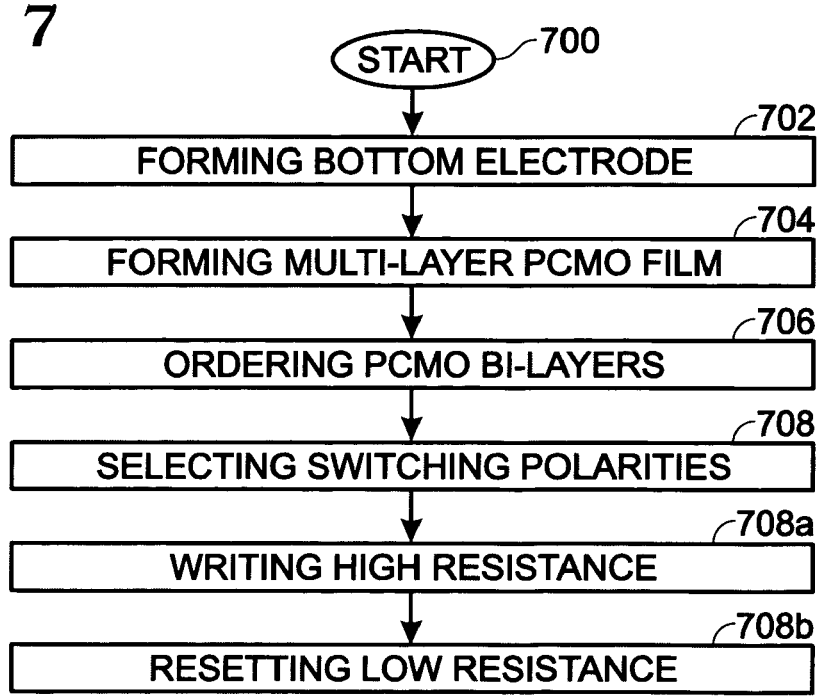

SYSTEM AND METHOD FOR FORMING A BIPOLAR SWITCHING PCMO FILM

BACKGROUND OF THE INVENTION

1. Field of the Invention

This invention generally relates to integrated circuit (IC) fabrication and, more particularly to a PCMO thin film, and associated deposition processes, with bipolar switching characteristics for use in Resistance Random Access Memory (RRAM) applications.

2. Description of the Related Art

Perovskite materials such as $Pr_{1-x}Ca_xMnO_3$ (PCMO) show reversible resistive switching properties that can be used for low power, low operation voltage, high-speed, high-density memory applications. Nano-sized PCMO materials are known to exhibit mono-polar switching properties, while crystallized PCMO materials shows bi-polar switching properties. However, PCMO thin films are also known to exhibit poor endurance properties.

A perfectly uniform electric pulse induced resistance variation (EPIR) material memory resistor can only be programmed to a high resistance state using a relatively large amplitude narrow pulse, and reset to a low resistance state using a wide electrical pulse. However, high voltage pulses may degrade the electrical properties of the memory resistor. Further, to protect against spikes in the power supply and fluctuating supply voltages, it is often desirable to program the RRAM memory using opposite polarity (bipolar) narrow pulses to write and reset the resistance of the memory resistors.

Various methods, such as tailoring the crystalline structure and oxygen content distribution, have been proposed to create a stable material with bipolar switching characteristics. Bipolar switching can be achieved in PCMO films where there are large differences in crystalline structure. However, such a structure is difficult to scale for very thin film, small size memory devices. Likewise, bipolar switching characteristics are observed if a PCMO film is made with a higher oxygen content in the upper portion of the memory thin film, than in the lower portion. This result can be achieved easily using an annealing process, for example. However, oxygen is mobile in RRAM materials such as PCMO. Therefore, there is a reliability issue related to oxygen migration if the temperature of the device is raised in subsequent device fabrication processes or during circuit operation.

It would be advantageous if reliable, low cost, easy to scale PCMO film process could be developed that produced a PCMO film with bipolar switching characteristics.

SUMMARY OF THE INVENTION

The present invention describes a PCMO film suitable for Resistive Random Access Memory devices (RRAM). Specifically, the invention describes a method for depositing $Pr_xCa_{1-x}MnO_3$ thin film materials with multi-layers of nanocrystalline and polycrystalline materials for RRAM applications using MOCVD techniques. The multilayer process improves the resultant RRAM memory resistor reliability.

Accordingly, a method is provided for forming a bipolar switching $Pr_xCa_{1-x}MnO_3$ (PCMO) thin film. The method comprises: forming a bottom electrode; depositing a nanocrystalline PCMO layer; depositing a polycrystalline PCMO layer; forming a multi-layer PCMO film with bipolar switching properties; and, forming top electrode overlying the PCMO film.

The nanocrystalline PCMO layer has crystal grains with a size in the range of 3 to 40 nanometers (nm), with a layer thickness in the range of 5 to 100 nm. The polycrystalline PCMO layer has grain crystals with a size in the range of 40 nm to epitaxial, with a layer thickness in the range of 5 to 100 nm. The number of PCMO bi-layers can be in the range of 2 to 20.

The multi-layer PCMO film has an overall greater resistance, a resistance ratio between the high and low resistance states that increases, and a switching voltage pulse amplitude that increases, in response to increasing the thicknesses of the nanocrystalline and polycrystalline layers. The PCMO film with an overall lower resistance, a resistance ratio between the high and low resistance states that decreases, and a switching voltage pulse amplitude that increases, in response to increasing the thicknesses of the nano and polycrystalline layers, while decreasing the number of bi-layers (maintaining a constant overall PCMO film thickness).

If the polycrystalline layers are deposited overlying the nanocrystalline layers, a high resistance can be written with narrow pulse width, negative voltage pulses. The PCMO film can be reset to a low resistance using a narrow pulse width, positive amplitude pulse. Likewise, if the nanocrystalline layers are deposited overlying the polycrystalline layers, a high resistance can be written with narrow pulse width, positive voltage pulses, and reset to a low resistance using a narrow pulse width, negative amplitude pulse.

Additional details of the above-described method and a multi-layer PCMO thin film capacitor with bipolar switching characteristics are presented below.

BRIEF DESCRIPTION OF THE DRAWINGS

FIG. 6 is a flowchart illustrating the present invention method for forming a bipolar switching $Pr_xCa_{1-x}MnO_3$ (PCMO) thin film.

FIG. 7 is a flowchart illustrating the present invention method for forming a PCMO thin film with selectable bipolar switching characteristics.

DETAILED DESCRIPTION OF THE PREFERRED EMBODIMENTS

Figure 1:
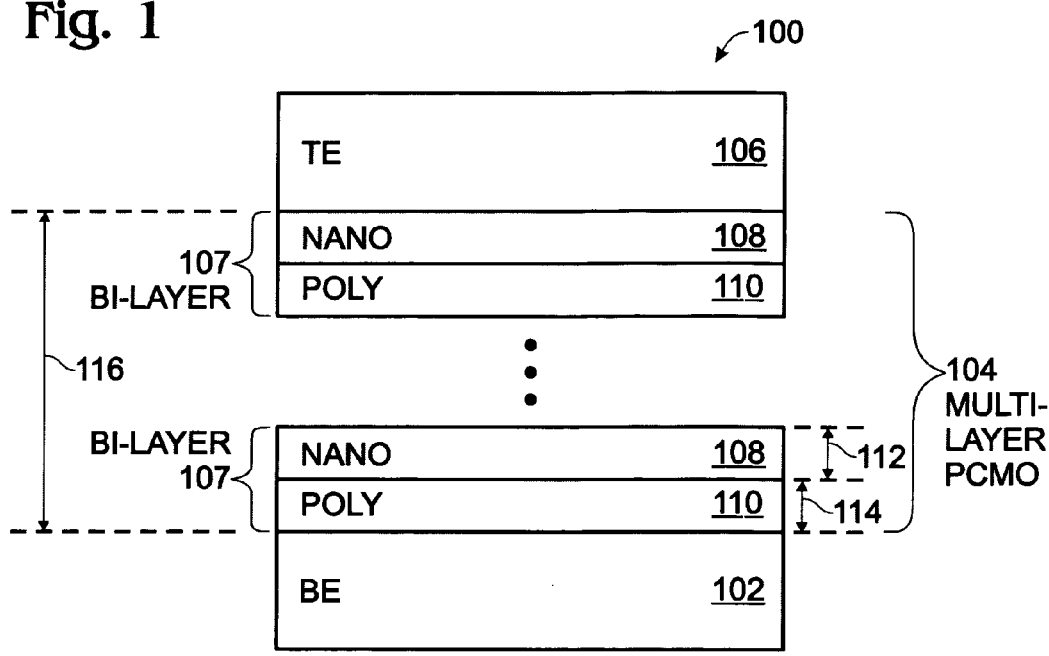
FIG. 1 is a partial cross-sectional view of the present invention $Pr_xCa_{1-x}MnO_3$ (PCMO) thin film capacitor with bipolar switching characteristics.

FIG. 1 is a partial cross-sectional view of the present invention $Pr_xCa_{1-x}MnO_3$ (PCMO) thin film capacitor with bipolar switching characteristics. The capacitor 100 comprises a bottom electrode (BE) 102, formed from a stack of materials such as Pt/x/SiO2/Si, and Ir/x/SiO2/Si, where x is a material such as Ti, TiN, or TaN. The bottom electrode can also be made from Pt, Ir, or Au. A multi-layer PCMO film 104, with bipolar switching properties, overlies the bottom electrode 102. The PCMO film 104 includes a nanocrystalline PCMO layer and a polycrystalline PCMO layer. A top electrode (TE) 106 overlies the multi-layer PCMO film 104. More explicitly, each PCMO bi-layer 107 includes a nanocrystalline PCMO layer 108 overlying a polycrystalline PCMO layer 110.

Figure 2:
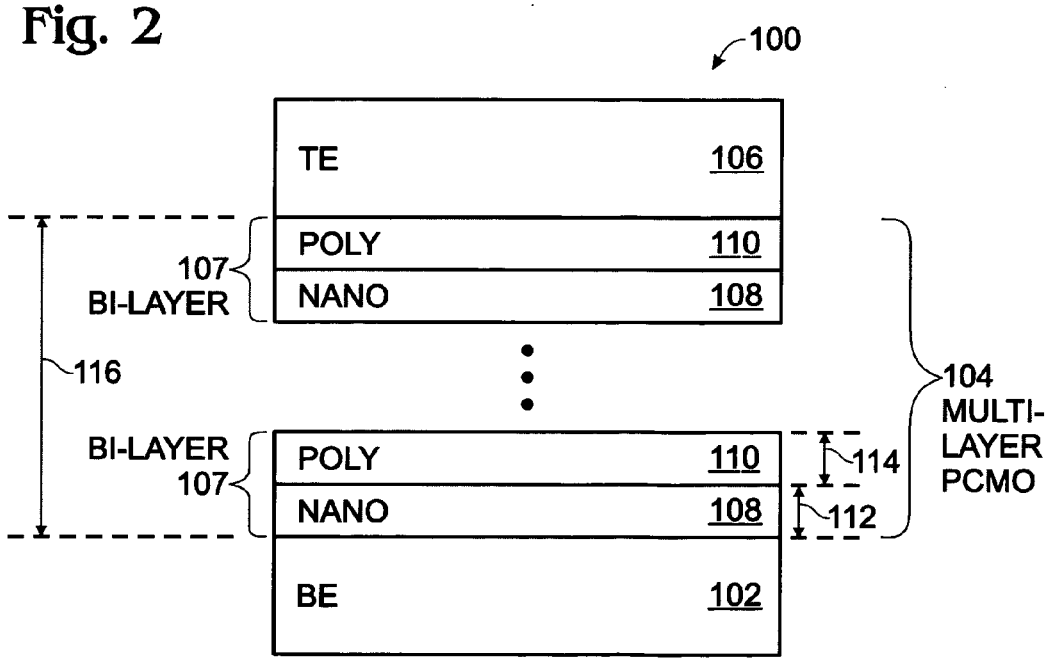
FIG. 2 is a partial cross-sectional view of the PCMO film capacitor, featuring a different aspect of the invention.

FIG. 2 is a partial cross-sectional view of the PCMO film capacitor, featuring a different aspect of the invention. In this aspect, each polycrystalline PCMO layer 110 overlies a nanocrystalline PCMO layer 108.

Referencing either FIG. 1 or 2, the nanocrystalline PCMO layer 108 has crystal grains with a size in the range of 3 to 40 nanometers (nm). The polycrystalline PCMO layer 110 has crystal grains with a size in the range of 40 nm to epitaxial (single crystal). The nanocrystalline PCMO layer 108 has a thickness 112 in the range of 5 to 100 nanometers (nm), and the polycrystalline PCMO layer 110 has a thickness in the range of 5 to 100 nm. The multi-layer PCMO film 104 may have a first number of nanocrystalline and polycrystalline bi-layers 107 in the range between 1 and 20. Note, the combined total of nanocrystalline and polycrystalline layer need not necessarily be an even number. Typically, the multi-layer PCMO film 104 includes a polycrystalline content is at least 20% of the total PCMO material. In other aspects, the polycrystalline content is in the range of 20 to 50%.

As a result, the multi-layer PCMO film 104 has the following bipolar switching properties:

a high resistance in the range of 10 to 1000 kilo ohms in response to a pulse having a voltage in the range of ±(2 to 10) volts (V), with a duration in the range of 5 nanosecond (ns) to 50 microseconds; and, a low resistance in the range of 500 ohms to 10 kilo ohms, in response to a pulse having a voltage in the range of ±(2 to 10) V, with a duration in the range of 5 ns to 50 microseconds.

The multi-layer PCMO film 104 has an overall greater resistance, a resistance ratio between the high and low resistance states that increases, and a switching voltage pulse amplitude that increases, in response to increasing the nanocrystalline thickness 112 and polycrystalline PCMO layer thickness 114.

Alternately, the multi-layer PCMO film has an overall lower resistance, a resistance ratio between the high and low resistance states that decreases, and a switching voltage pulse amplitude that increases, in response to increasing the thickness 112 and thickness 114, while decreasing the first number of bi-layers, and maintaining a constant overall thickness 116 that is a thickness combination of each of the nanocrystalline and polycrystalline layers 108/110.

Referencing just FIG. 1, when the nanocrystalline PCMO layer 108 overlies the bottom electrode 102 and the polycrystalline PCMO layer 110 overlies the nanocrystalline layer 108, the multi-layer PCMO film 104 has the following bipolar switching properties:

a high resistance in the range of 10 to 1000 kilo ohms in response to a pulse having a voltage in the range of −(2 to 10) V, with a duration in the range of 5 ns to 50 microseconds; and, a low resistance in the range of 500 ohms to 10 kilo ohms, in response to a pulse having a voltage in the range of +(2 to 10) V, with a duration in the range of 5 ns to 50 microseconds.

Referencing just FIG. 2, when the polycrystalline PCMO layer 110 overlies the bottom electrode 102, and the nanocrystalline PCMO layer 108 overlies the polycrystalline layer 110, the multi-layer PCMO film 104 has the following bipolar switching properties:

a high resistance in the range of 10 to 1000 kilo ohms in response to a pulse having a voltage in the range of +(2 to 10) V, with a duration in the range of 5 ns to 50 microseconds; and, a low resistance in the range of 500 ohms to 10 kilo ohms, in response to a pulse having a voltage in the range of −(2 to 10) V, with a duration in the range of 5 ns to 50 microseconds.

Alternately, the multi-layer PCMO film 104 of FIGS. 1 and 2 may be thought of as having selectable resistance switching properties responsive to the order of the PCMO layers. When the polycrystalline PCMO layer 110 overlies the nanocrystalline PCMO layer 108 (FIG. 2), the resistance switching polarities are as follows:

a high resistance responsive to a negative polarity voltage pulse; and, a low resistance responsive to a positive polarity voltage pulse.

When the nanocrystalline PCMO layer 108 overlies the polycrystalline PCMO layer 110 (FIG. 1), the resistance switching polarities are as follows:

a high resistance responsive to a positive polarity voltage pulse; and, a low resistance responsive to a negative polarity voltage pulse.

FUNCTIONAL DESCRIPTION

The contents of nano-sized (nanocrystalline) and fully crystallized (polycrystalline) grains have a great influence on switching properties. Experimental results show that nano-sized PCMO thin films exhibit mono-polar switching properties and crystallized PCMO thin films exhibits bipolar switching properties. Therefore, by modulating the nano-sized and fully crystallized grain content in RRAM memory cell, a memory cell can be programmed using either unipolar or bipolar process. In addition, the device is asymmetric in structure, due to the ordering of the bi-layers, and does not require a high programming voltage. This present invention describes a method for depositing a combination of nano-sized and crystallized PCMO thin film layers for RRAM applications.

The following are examples of processes used for depositing $Pr_{1-x}Ca_xMnO_3$ thin films with multi-layer PMO/CMO and superlattice of PMO/CMO by using liquid delivery MOCVD techniques. The precursors are solid organometallic compounds: $Pr(thd)_3$, $Ca(thd)_2$, $Mn(thd)_3$. The organic solvents are butylether and tetraglyme. The substrates (bottom electrodes) are Pt/(Ti or TiN or TaN)/SiO2/Si, Ir/(Ti or TiN or TaN)/SiO2/Si.

Generally, $Pr(thd)_3$, $Ca(thd)_2$, $Mn(thd)_3$ with molar ratio around (0.9:0.5:1), (0.9:0.6:1) and (1.04:0.62:1) of Pr:Ca:Mn are dissolved in a mixed solvent of butyl ether and tetraglyme in the volume ratio of 3:1. The precursor solutions have a concentration of 0.1 M/L of metals in PCMO. The solution is injected into a vaporizer at temperature in the range of 220–300° C. by a liquid flow meter at a rate of 0.1–0.5 ml/min to form precursor vapors. The feed line is kept at 230–300° C. The two MOCVD processes for nano-sized and crystallized PCMO thin films can be differentiated as follows:

Nano-Sized PCMO Thin Films (Process A)
Precursor solution with a ratio of about 1.04:0.62:1 of Pr:Ca:Mn;
Deposition temperatures and pressure: 350–420° C. and 1–5 Torr, respectively;
Oxygen partial pressures: 20–30%;
Vaporizer temperature: 250–300° C.;
Solution delivery rates: 0.1–0.5 ml/min; and,
Deposition time: 1–30 minutes depending on the desired film thickness.

Polycrystallized PCMO Thin Films (Process B)
Precursor solution with a ratio of about 0.9:0.5:1 of Pr:Ca:Mn;
Deposition temperatures and pressure: 420–550° C. and 1–5 Torr, respectively;
Oxygen partial pressures: 20–30%;
Vaporizer temperature: 220–260° C.;
Solution delivery rates: 0.1–0.5 ml/min; and,
Deposition time: 1–30 minutes depending on the desired film thickness.

Alternating between the nano and polycrystalline processes, a combination of nano-sized (nanocrystalline) and crystallized (polycrystalline) PCMO thin film layers can be deposited.

The compositions of PCMO thin films were measured by X-ray analysis (EDX) and phases of the PCMO thin films are identified using x-ray diffraction.

Experimental Results

Figure 3A:
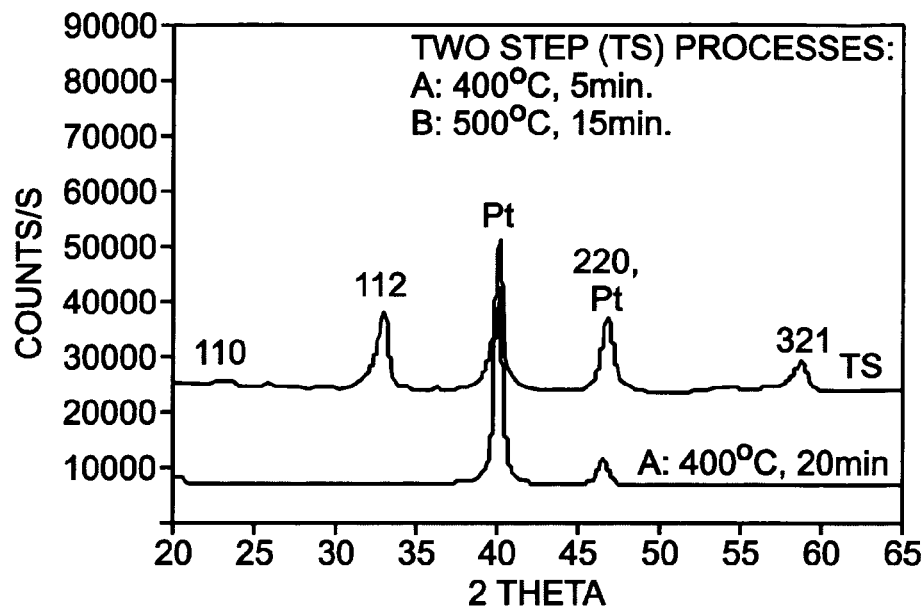
FIGS. 3A and 3B show the x-ray patterns of the PCMO thin films deposited using the nanocrystalline and polycrystalline processes, respectively.
Figure 3B:
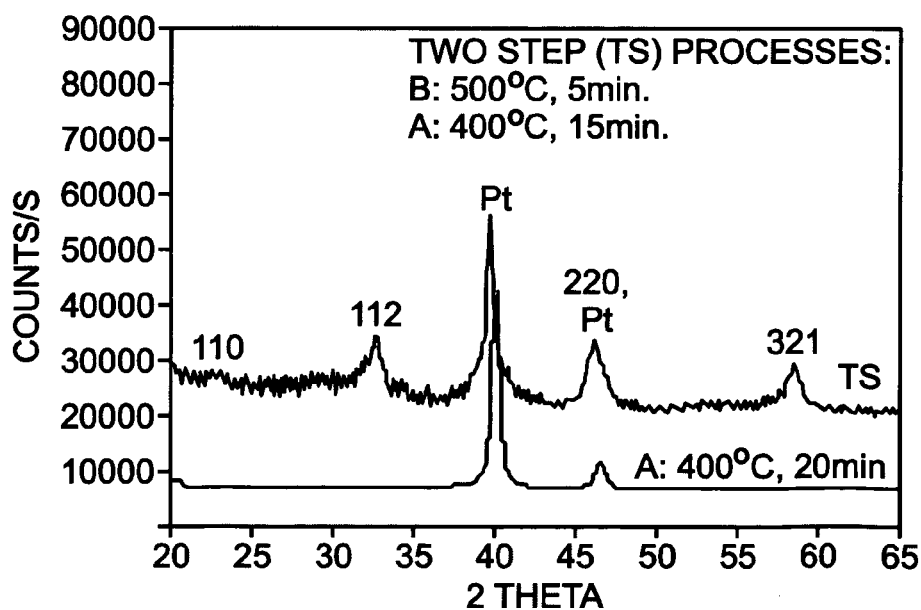

FIGS. 3A and 3B show the x-ray patterns of the PCMO thin films deposited using the nanocrystalline and polycrystalline processes, respectively. In FIG. 3A the PCMO thin film is first deposited at 400° C. for 5 minutes (the nanocrystalline process), and then the temperature is increased to 500° C. for 15 minutes (the polycrystalline process). The x-ray patterns show strong 110, 112 and 321 PCMO peaks, meaning that a highly-crystallized PCMO thin film is formed.

In FIG. 3B the PCMO thin film is first deposited at 500° C. for 5 minutes (the polycrystalline process), and then the temperature is decreased to 400° C. for 15 minutes (the nanocrystalline process). The x-ray pattern shows smaller 110, 112 and 321 PCMO peaks, meaning that the nanocrystalline layer is formed on a highly-crystallized PCMO thin film. By alternating between processes, a combination of nano-sized and polycrystalline PCMO thin film layers can be obtained, which improves the endurance properties of the resultant PCMO multi-layer film.

Figure 4:
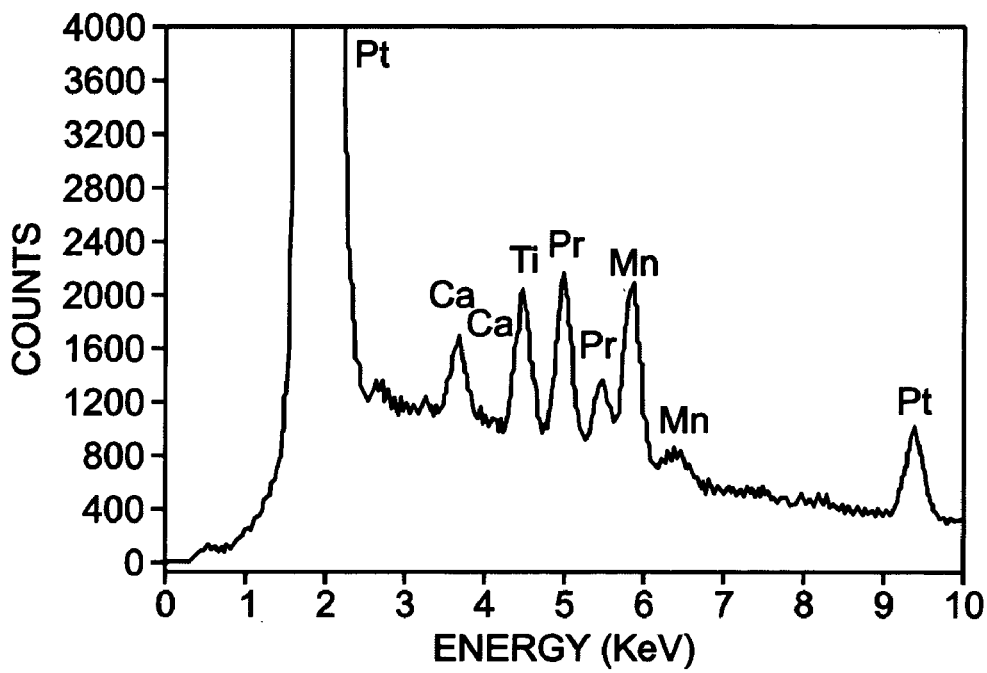
FIG. 4 shows the EDX pattern of layered nano-sized and crystallized PCMO thin films.

FIG. 4 shows the EDX pattern of layered nano-sized and crystallized PCMO thin films. The composition of the PCMO thin film is about $Pr_{0.7}Ca_{0.3}Mn_{0.95}O_3$.

Figure 5:
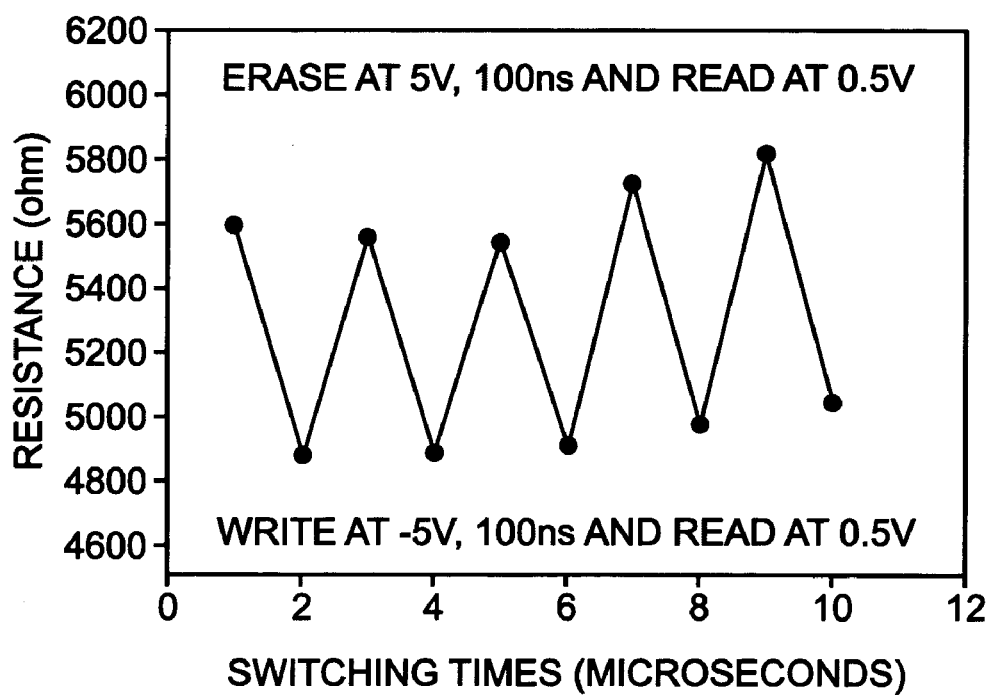
FIG. 5 shows the switching properties of the PCMO thin film with a layered nanocrystalline and crystallized structure.

FIG. 5 shows the switching properties of the PCMO thin film with a layered nanocrystalline and crystallized structure. The PCMO thin film was first deposited at 500° C. for 5 minutes and then the temperature decreased to 400° C. for 15 minutes for final deposition. The x-ray of the PCMO sample of FIG. 3B exhibits smaller 110, 112, and 321 peaks. This PCMO thin film shows only bipolar switching characteristics. With increased pulse time, the resistance changes ratio increases. FIG. 5 also shows stable switching properties. Higher Mn-content PCMO thin films are even more stable.

FIG. 6 is a flowchart illustrating the present invention method for forming a bipolar switching $Pr_xCa_{1-x}MnO_3$ (PCMO) thin film. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 forms a bottom electrode. The bottom electrode can be made from Pt, Au, Ir, or a stack of materials such as Pt/x/SiO2/Si or Ir/x/SiO2/Si, where x is a material selected from the group including Ti, TiN, and TaN. Step 604 prepares a precursor. Step 606 deposits a nanocrystalline PCMO layer. Step 608 deposits a polycrystalline PCMO layer. In some aspects, Step 608 occurs before Step 606. In other aspects, Step 606 occurs before Step 608. Typically, Steps 606 and 608, in whichever order, are iterated a number of times. Step 610 forms a multi-layer PCMO film with bipolar switching properties. in some aspects, Step 610 forms a multilayer PCMO film where the polycrystalline content is at least 20% of the total PCMO material. Step 612 forms a top electrode overlying the multi-layer PCMO film.

In some aspects, Step 606 deposits a nanocrystalline PCMO layer with crystal grains having a size in the range of 3 to 40 nanometers (nm), and a thickness in the range of 5 to 100 nm. Likewise, Step 608 deposits a polycrystalline PCMO layer with crystal grains having a size in the range of 40 nm to epitaxial, and a thickness in the range of 5 to 100 nm.

In a different aspect, Step 606 deposits a first number of nanocrystalline PCMO layers, each having a first thickness, and Step 608 deposits the first number a polycrystalline PCMO layers, each having a second thickness. Then, forming a multi-layer PCMO film with bipolar switching properties in Step 610 includes forming a PCMO film with a first number of bi-layers. The first number of bi-layer may vary in the range between 1 and 20.

In one aspect Step 604 prepares a precursor solution as follows:
introducing Pr(thd)3, Ca(thd)2, and Mn(thd)3 with a molar ratio of about (0.9:0.5:1), (0.9:0.6:1), and (1.04:0.62:1), respectively, dissolved in a solvent selected from the group including butylether and tetraglyme, in a volume ratio of about 3:1, and a concentration of 0.1 mole PCMO material per liter;
injecting the precursor into a vaporizer at a temperature in the range of 220 to 300 degrees C., using a water flow meter at a rate of 0.1 to 0.5 milliliter/minute (ml/min); and,
introducing precursor vapor to a deposition chamber using a feedline at a temperature in the range of 230 to 300 degrees C.

The following process specifics are common to both the nanocrystalline PCMO deposition step (Step 606) and polycrystalline PCMO deposition step (Step 608):
maintaining a deposition chamber pressure in the range of 1 to 5 Torr;
creating an oxygen partial pressure in the range of 20 to 30%; and,
delivering the precursor vapor for a duration in the range of 1 to 30 min.

With respect to the deposition a nanocrystalline PCMO layer in Step 606, Step 604:
prepares a precursor with Pr:Ca:Mn in a ratio of about 1.04: 0.62:1;
injects precursor at a temperature in the range between 250 and 300 degrees C.; and,
maintains a deposition temperature in the range of 350 to 420 degrees C.

With respect to the deposition of a polycrystalline PCMO layer in Step 608, Step 604:

prepares precursor with Pr:Ca:Mn in a ratio of about 0.8:0.5:1;

injects precursor at a temperature in the range between 220 and 260 degrees C.; and, maintains a deposition temperature in the range of 420 to 550 degrees C.

Forming a multi-layer PCMO film with bipolar switching properties in Step 610 includes substeps. Step 610*a* writes a high resistance in the range of 10 to 1000 kilo ohms in response to a pulse having a voltage in the range of ±(2 to 10) volts (V), with a duration in the range of 5 nanosecond (ns) to 50 microseconds. Step 610*b* resets to a low resistance in the range of 500 ohms to 10 kilo ohms, in response to a pulse having a voltage in the range of ±(2 to 10) V, with a duration in the range of 5 ns to 50 microseconds.

In one aspect, forming a multi-layer PCMO film with bipolar switching properties in Step 610 includes forming a multi-layer PCMO film with an overall greater resistance, a resistance ratio between the high and low resistance states that increases, and a switching voltage pulse amplitude that increases, in response to increasing the first and second thicknesses (Steps 606 and 608).

In another aspect, forming a multi-layer PCMO film with a first number of bi-layer in Step 610 includes forming a multi-layer PCMO film with an overall lower resistance, a resistance ratio between the high and low resistance states that decreases, and a switching voltage pulse amplitude that increases, in response to increasing the first and second thicknesses, while decreasing the first number of layers, and maintaining a constant overall thickness that is a thickness combination of each of the nanocrystalline and polycrystalline layers.

In one aspect, Step 606 deposits a nanocrystalline PCMO layer overlying the bottom electrode, and Step 608 deposits a polycrystalline PCMO layer overlying the nanocrystalline layer. That is, Step 606 occurs before Step 608. Then, Step 610*a* writes a high resistance in the range of 10 to 1000 kilo ohms in response to a pulse having a voltage in the range of −(2 to 10) V, with a duration in the range of 5 ns to 50 microseconds. Step 610*b* resets to a low resistance in the range of 500 ohms to 10 kilo ohms, in response to a pulse having a voltage in the range of +(2 to 10) V, with a duration in the range of 5 ns to 50 microseconds.

In a different aspect, Step 608 deposits a polycrystalline PCMO layer overlying the bottom electrode and Step 606 deposits a nanocrystalline PCMO layer overlying the polycrystalline layer. That is, Step 608 occurs before Step 606. Then, Step 610*a* writes a high resistance in the range of 10 to 1000 kilo ohms in response to a pulse having a voltage in the range of +(2 to 10) V, with a duration in the range of 5 ns to 50 microseconds. Step 610*b* resets to a low resistance in the range of 500 ohms to 10 kilo ohms, in response to a pulse having a voltage in the range of −(2 to 10) V, with a duration in the range of 5 ns to 50 microseconds.

FIG. 7 is a flowchart illustrating the present invention method for forming a PCMO thin film with selectable bipolar switching characteristics. The method starts at Step 700. Step 702 forms a bottom electrode. Step 704 forms a multi-layer PCMO film with a bi-layer including a nanocrystalline PCMO layer and a polycrystalline PCMO layer. Step 706 orders the PCMO bi-layer. Step 708, in response to the PCMO bi-layer ordering, selects the resistance switching polarities.

In one aspect, ordering the PCMO bi-layer in Step 706 includes forming the polycrystalline PCMO layer overlying the nanocrystalline PCMO layer. Then, selecting the resistance switching polarities in Step 708 includes substeps. Step 708*a* writes a high resistance in response to a negative polarity voltage pulse. Step 708*b* resets a low resistance in response to a positive polarity voltage pulse.

Alternately, ordering the PCMO bi-layer in Step 706 includes forming the nanocrystalline PCMO layer overlying the polycrystalline PCMO layer. Then, Step 708*a* writes a high resistance in response to a positive polarity voltage pulse, and Step 708*b* resets a low resistance in response to a negative polarity voltage pulse.

A multi-layer PCMO thin film with bipolar switching properties and associated MOCVD deposition process have been presented. Examples of some process specifics and some film characteristics have been given to clarify the invention. However, the invention is not limited to just these examples. Other variations and embodiments of the invention will occur to those skilled in the art.

We claim:

1. A method for forming a bipolar switching $Pr_xCa_{1-x}MnO_3$ (PCMO) thin film, the method comprising:
   forming a bottom electrode;
   depositing a nanocrystalline PCMO layer;
   depositing a polycrystalline PCMO layer; and,
   forming a multi-layer PCMO film with bipolar switching properties.

2. The method of claim 1 wherein depositing a nanocrystalline PCMO layer includes depositing a PCMO layer with crystal grains having a size in the range of 3 to 40 nanometers (nm).

3. The method of claim 1 wherein depositing a polycrystalline PCMO layer includes depositing a PCMO layer with crystal grains having a size in the range of 40 nm to epitaxial.

4. The method of claim 1 wherein forming a bottom electrode includes forming a bottom electrode from a material selected from the group including Pt, Au, Er, and a stack of materials including Ptlx/SiO2/Si and Ir/x/SiO2/Si, where x is a material selected from the group including Ti, TiN, and TaN.

5. The method of claim 1 further comprising:
   preparing a precursor solution as follows:
      introducing Pr(thd)3, Ca(thd)2, and Mn(thd)3 with a molar ratio of about (0.9:0.5:1), (0.9:0.6:1), and (1.04:0.62:1), respectively, dissolved in a solvent selected from the group including butylether and tetraglyme, in a volume ratio of about 3:1, and a concentration of 0.1 mole PCMO material per liter;
      injecting the precursor into a vaporizer at a temperature in the range of 220 to 300 degrees C., using a water flow meter at a rate of 0.1 to 0.5 milliliter/minute (ml/mm);
      introducing precursor vapor to a deposition chamber using a feedline at a temperature in the range of 230 to 300 degrees C.; and,
   wherein depositing the nanocrystalline and polycrystalline PCMO layers includes:
      maintaining a deposition chamber pressure in the range of 1 to 5 Torr;
      creating an oxygen partial pressure in the range of 20 to 30%; and,
      delivering the precursor vapor for a duration in the range of 1 to 30 min.

6. The method of claim 5 wherein introducing Pr(thd)3, Ca(thd)2, and Mn(thd)3 includes preparing precursor with Pr:Ca:Mn in a ratio of about 1.04:0.62:1;
   wherein injecting the precursor into a vaporizer at a temperature in the range of 220 to 300 degrees C.

includes injecting precursor at a temperature in the range between 250 and 300 degrees C.;
wherein depositing a nanocrystalline PCMO layer includes maintaining a deposition temperature in the range of 350 to 420 degrees C.; and,
wherein a nanocrystalline PCMO layer is deposited.

7. The method of claim 5 wherein introducing Pr(thd)3, Ca(thd)2, and Mn(thd)3 includes preparing precursor with Pr:Ca:Mn in a ratio of about 0.8:0.5:1;
wherein injecting the precursor into a vaporizer at a temperature in the range of 220 to 300 degrees C. includes injecting precursor at a temperature in the range between 220 and 260 degrees C.;
wherein depositing a polycrystalline PCMO layer includes maintaining a deposition temperature in the range of 420 to 550 degrees C.; and,
wherein a polycrystalline PCMO layer is deposited.

8. The method of claim 1 wherein forming a multi-layer PCMO film with bipolar switching properties includes:
writing a high resistance in the range of 10 to 1000 kilo ohms in response to a pulse having a voltage in the range of ±(2 to 10) volts (V), with a duration in the range of 5 nanosecond (na) to 50 microseconds; and,
resetting to a low resistance in the range of 500 ohms to 10 kilo ohms, in response to a pulse having a voltage in the range of ±(2 to 10) V, with a duration in the range of 5 na to 50 microseconds.

9. The method of claim 1 wherein depositing a nanocrystalline PCMO layer includes depositing a nanocrystalline layer having a thickness in the range of 5 to 100 nanometers (nm); and
wherein depositing a polycrystalline PCMO layer includes depositing a polycrystalline layer having a thickness in the range of 5 to 100 nm.

10. The method of claim 8 wherein depositing a nanocrystalline PCMO layer includes depositing a nanocrystalline PCMO layer with a first thickness;
wherein depositing a polycrystalline PCMO layer includes depositing a polycrystalline PCMO layer with a second thickness; and,
wherein forming a multi-layer PCMO film with bipolar switching properties includes forming a bi-layer PCMO film with an overall greater resistance, a resistance ratio between the high and low resistance states that increases, and a switching voltage pulse amplitude that increases, in response to increasing the first and second thicknesses.

11. The method of claim 8 wherein depositing a nanocrystalline PCMO layer includes depositing a first number of nanocrystalline PCMO layers, each having a first thickness;
wherein depositing a polycrystalline PCMO layer includes depositing the first number a polycrystalline PCMO layers, each having a second thickness; and,
wherein forming a multi-layer PCMO film with bipolar switching properties includes forming a multi-layer PCMO film with a first number of bi-layers.

12. The method of claim 11 wherein forming a multi-layer PCMO film with a first number of bi-layers includes forming a PCMO film where the first number of bi-layer varies in the range between 2 and 20.

13. The method of claim 11 wherein forming a multi-layer PCMO film with a first number of bi-layers includes forming a PCMO film with an overall lower resistance, a resistance ratio between the high and low resistance states that decreases, and a switching voltage pulse amplitude that increases, in response to increasing the first and second thicknesses, while decreasing the first number of layers, and maintaining a constant overall thickness that is a thickness combination of each of the nanocrystalline and polycrystalline layers.

14. The method of claim 8 wherein depositing a nanocrystalline PCMO layer includes depositing a nanocrystalline PCMO layer overlying the bottom electrode;
wherein depositing a polycrystalline PCMO layer includes depositing a polycrystalline PCMO layer overlying the nanocrystalline layer; and,
wherein forming a multi-layer PCMO film with bipolar switching properties includes:
writing a high resistance in the range of 10 to 1000 kilo ohms in response to a pulse having a voltage in the range of −(2 to 10) V, with a duration in the range of 5 ns to 50 microseconds; and,
resetting to a low resistance in the range of 500 ohms to 10 kilo ohms, in response to a pulse having a voltage in the range of +(2 to 16) V, with a duration in the range of 5 ns to 50 microseconds.

15. The method of claim 8 wherein depositing a polycrystalline PCMO layer includes depositing a polycrystalline PCMO) layer overlying the bottom electrode;
wherein depositing a nanocrystalline PCMO Layer includes depositing a nanocrystalline PCMO layer overlying the polycrystalline layer; and,
wherein forming a multi-layer PCMO film with bipolar switching properties includes:
writing a high resistance in the range of 10 to 1000 kilo ohms in response to a pulse having a voltage in the range of +(2 to 10) V, with a duration in the range of 5 ns to 50 microseconds; and,
resetting to a low resistance in the range of 500 ohms to 10 kilo ohms, in response to a pulse having a voltage in the range of −(2 to 10) V, with a duration in the range of 5 ns to 50 microseconds.

16. The method of claim 1 further comprising:
forming a top electrode overlying the multi-layer PCMO film.

17. The method of claim 1 wherein forming a multi-layer PCMO film with bipolar switching properties includes forming a multilayer PCMO film where the polycrystalline content is at least 20% of the total PCMO material.

18. A method for forming a $Pr_xCa_{1-x}MnO_3$ (PCMO) thin film with selectable bipolar switching characteristics, the method comprising:
forming a bottom electrode;
forming a multi-layer PCMO film, with a bi-layer including a nanocrystalline PCMO layer and a polycrystalline PCMO layer;
ordering the PCMO bi-layer; and,
in response to the PCMO bi-layer ordering, selecting the resistance switching polarities.

19. The method of claim 18 wherein ordering the PCMO bi-layer includes forming the polycrystalline PCMO layer overlying the nanocrystalline PCMO layer; and,
wherein selecting the resistance switching polarities includes:
writing a high resistance in response to a negative polarity voltage pulse; and,
resetting a low resistance in response to a positive polarity voltage pulse.

20. The method of claim 18 wherein ordering the PCMO bi-layer includes forming the nanocrystalline PCMO layer overlying the polycrystalline PCMO layer; and,
wherein selecting the resistance switching polarities includes:

writing a high resistance in response to a positive polarity voltage pulse; and, resetting a low resistance in response to a negative polarity voltage pulse.

21. A method for forming a bipolar switching $Pr_xCa_{1-x}MnO_3$ (PCMO) thin film, the method comprising:

forming a bottom electrode;

preparing a precursor solution as follows:
introducing Pr(thd)3, Ca(thd)2, and Mn(thd)3 with a molar ratio of about (0.9:0.6:1), (0.9:0.6:1), and (1.04:0.62:1), respectively, dissolved in a solvent selected from the group including butylether and tetraglyme, in a volume ratio of about 3:1, and a concentration of 0.1 mole PCMO material per liter;

injecting the precursor into a vaporizer at a temperature in the range of 220 to 300 degrees C., using a water flow meter at a rate of 0.1 to 0.5 milliliter/minute (ml/min);

introducing precursor vapor to a deposition chamber using a feedline at a temperature in the range of 230 to 300 degrees C.;

depositing nanocrystalline and polycrystalline PCMO layers as follows:
maintaining a deposition chamber pressure in the range of 1 to 5 Torr;

creating an oxygen partial pressure in the range of 20 to 30%; and, delivering the precursor vapor for a duration in the range of 1 to 30 mm; and, forming a multi-layer PCMO film with bipolar switching properties.

* * * * *